US010999920B1

(12) United States Patent
Puttanna et al.

(10) Patent No.: US 10,999,920 B1
(45) Date of Patent: *May 4, 2021

(54) APPARATUS, SYSTEM, AND METHOD FOR MITIGATING CROSSTALK IN BALL GRID ARRAY DEVICES

(71) Applicant: Juniper Networks, Inc., Sunnyvale, CA (US)

(72) Inventors: Shreyas Puttanna, Bangalore (IN); Raja CT Anand, Bangalore (IN); Nagaraj A, Bangalore (IN)

(73) Assignee: Juniper Networks, Inc, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/944,183

(22) Filed: Jul. 31, 2020

Related U.S. Application Data

(63) Continuation of application No. 16/358,446, filed on Mar. 19, 2019, now Pat. No. 10,806,023.

(51) Int. Cl.
| | |
|---|---|
| *H05K 7/00* | (2006.01) |
| *H05K 1/02* | (2006.01) |
| *H05K 1/18* | (2006.01) |
| *H05K 3/32* | (2006.01) |
| *H05K 1/11* | (2006.01) |

(52) U.S. Cl.
CPC ........... *H05K 1/0216* (2013.01); *H05K 1/115* (2013.01); *H05K 1/18* (2013.01); *H05K 3/32* (2013.01); *H05K 2201/10734* (2013.01)

(58) Field of Classification Search
USPC .................................................. 361/761, 760
See application file for complete search history.

(56) References Cited

U.S. PATENT DOCUMENTS

| | | | | |
|---|---|---|---|---|
| 7,890,688 | B2 * | 2/2011 | Lichtenegger | ........ G06F 13/385 710/303 |
| 2004/0043287 | A1 * | 3/2004 | Bando | ............... H01M 10/6566 429/156 |
| 2016/0043508 | A1 * | 2/2016 | Helster | .............. H01R 13/6467 439/607.07 |

OTHER PUBLICATIONS

Non-Final Office Action received for U.S. Appl. No. 16/358,446 dated Feb. 20, 2020, 24 pages.
Notice of Allowance received for U.S. Appl. No. 16/358,446 dated Jul. 10, 2020, 27 pages.

* cited by examiner

*Primary Examiner* — Andargie M Aychillhum
(74) *Attorney, Agent, or Firm* — FisherBroyles, LLP

(57) ABSTRACT

A disclosed apparatus may include (1) a circuit board and (2) a set of conductive contacts incorporated into the circuit board, wherein the conductive contacts (A) include a first positive/negative contact pair that is laid out in a first direction along the circuit board, (B) include a second positive/negative contact pair that is laid out in a second direction that is perpendicular to the first direction along the circuit board, and (C) facilitate electrically coupling, to the circuit board, at least one communication device that implements a differential signaling scheme. Various other apparatuses, systems, and methods are also disclosed.

20 Claims, 13 Drawing Sheets

APPARATUS, SYSTEM, AND METHOD FOR MITIGATING CROSSTALK IN BALL GRID ARRAY DEVICES

CROSS REFERENCE TO RELATED APPLICATION

This application is a continuation of U.S. application Ser. No. 16/358,446 filed 19 Mar. 2019, the disclosure of which is incorporated in its entirety by this reference.

BACKGROUND

As switching speeds and/or data rates increase in SerDes devices, so too may the amount of crosstalk introduced by these SerDes devices into other circuit components. For example, a Ball Grid Array (BGA) device may include multiple SerDes transmitters that transmit communications to other devices. These SerDes transmitters may switch back and forth at a certain speed to modulate the transmissions.

Continuing with this example, the BGA device may also include multiple SerDes receivers that receive communications from other devices. Unfortunately, these SerDes receivers may be adversely affected by crosstalk introduced by the SerDes transmitters. For example, the switching of the SerDes transmitters may generate crosstalk interference that adversely affects the functionality of the SerDes receivers within the BGA device. The adverse effects of such crosstalk interference may worsen with higher switching speeds, when the SerDes transmitters are switching simultaneously and/or in phase with one another, and/or depending on the pinout arrangement of the BGA device.

The instant disclosure, therefore, identifies and addresses a need for additional and improved apparatuses, systems, and methods for mitigating crosstalk in BGA devices.

SUMMARY

As will be described in greater detail below, the instant disclosure generally relates to apparatuses, systems, and methods for mitigating crosstalk in BGA devices. In one example, an apparatus for accomplishing such a task may include (1) a circuit board and (2) a set of conductive contacts incorporated into the circuit board, wherein the conductive contacts (A) include a first positive/negative contact pair that is laid out in a first direction along the circuit board, (B) include a second positive/negative contact pair that is laid out in a second direction that is perpendicular to the first direction along the circuit board, and (C) facilitate electrically coupling, to the circuit board, at least one communication device that implements a differential signaling scheme.

Similarly, a system that implements the above-identified apparatus may include (1) a circuit board, (2) a set of conductive contacts incorporated into the circuit board, wherein the conductive contacts (A) include a first positive/negative contact pair that is laid out in a first direction along the circuit board and (B) include a second positive/negative contact pair that is laid out in a second direction that is perpendicular to the first direction along the circuit board, and (3) at least one communication device electrically coupled to the circuit board by way of the conductive contacts.

Additionally or alternatively, a corresponding method may include a proxy interface that is communicatively coupled to (1) disposing a set of conductive contacts into a circuit board, wherein the conductive contacts (A) include a first positive/negative contact pair that is laid out in a first direction along the circuit board and (B) include a second positive/negative contact pair that is laid out in a second direction that is perpendicular to the first direction along the circuit board and (2) electrically coupling, to the circuit board by way of the conductive contacts, at least one communication device that implements a differential signaling scheme.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

FIG. 10 is an illustration of an exemplary arrangement of conductive vias incorporated into a circuit board for mitigating crosstalk in BGA devices.

Figure 1:
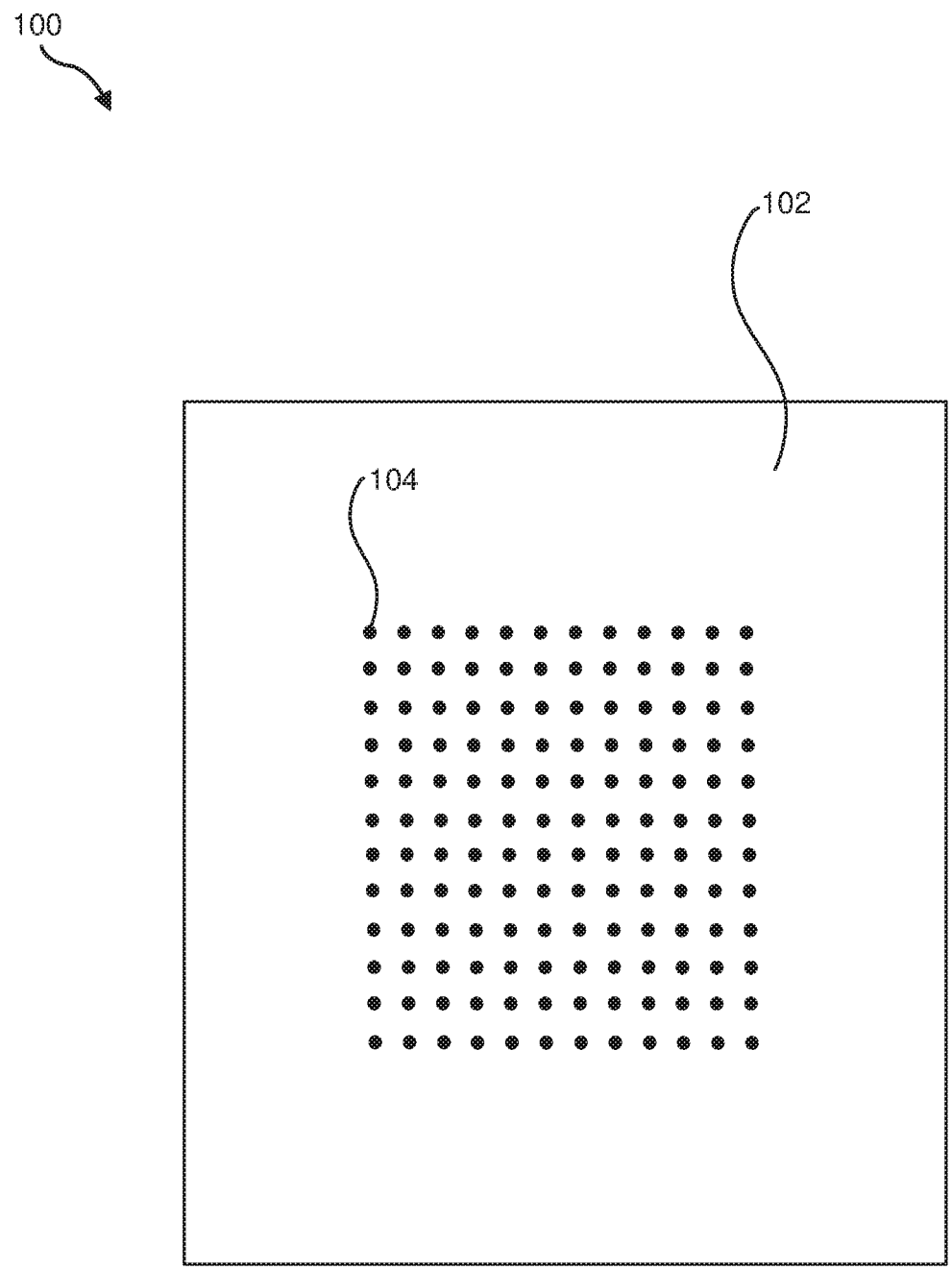
FIG. 1 is an illustration of an exemplary apparatus for mitigating crosstalk in BGA devices.

Throughout the drawings, identical reference characters and descriptions indicate similar, but not necessarily identical, elements. While the exemplary embodiments described herein are susceptible to various modifications and alternative forms, specific embodiments have been shown byway of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure describes various apparatuses, systems, and methods for mitigating crosstalk in BGA devices. As will be explained in greater detail below, embodiments of the instant disclosure may reduce the amount of crosstalk impacting and/or experienced by BGA communication devices included on circuit boards. Some embodiments may be able to achieve this reduction in the amount of crosstalk without increasing the pin pitch of such BGA communication devices and/or adding more return vias to the design and/or layout of the circuit boards. By doing so, these embodiments may improve and/or optimize the performance of such BGA communication devices even with higher switching speeds and/or higher data rates. For example, receivers within the BGA-packaged SerDes devices may function better, and their ground bounce and Bit Error Rates (BERs) may improve. In addition, such SerDes devices may still function properly even as the routing channel lengths increase on corresponding circuit boards.

The following will provide, with reference to FIGS. 1-12, detailed descriptions of exemplary apparatuses, systems, and corresponding implementations for mitigating crosstalk in BGA devices. In addition, detailed descriptions of corresponding computer-implemented methods will be provided in connection with FIG. 13.

FIG. 1 shows an exemplary apparatus 100 that facilitates mitigating crosstalk in BGA devices. As illustrated in FIG. 1, apparatus 100 may include and/or represent a circuit board 102 and a set of conductive contacts 104. Circuit board 102 generally represents any piece of insulating material that facilitates mounting (e.g., mechanical support) and/or interconnection (e.g., electrical coupling) of electrical and/or electronic components. In one example, circuit board 102 may include and/or represent a Printed Circuit Board (PCB). Examples of circuit board 102 include, without limitation, single-sided boards, double-sided boards, multi-layer boards, motherboards, linecards, backplanes, midplanes, and/or any other suitable type of circuit board. Various components (such as BGA-packaged communication devices) may be laminated, etched, attached, soldered, and/or otherwise coupled to circuit board 102.

In some examples, circuit board 102 may include various electrically conductive layers and/or traces (not explicitly illustrated in FIG. 1). Such conductive layers and/or traces may include and/or represent electrically conductive materials. Examples of such electrically conductive materials include, without limitation, copper, aluminum, silver, gold, alloys of one or more of the same, combinations or variations of one or more of the same, and/or any other suitable materials.

In one example, each layer may include and/or represent a conductive plane that is etched and/or laid during the fabrication phase to produce various conductive traces throughout circuit board 102. In this example, the etched and/or laid conductive traces may be separated from and/or interconnected with one another as necessary to form one or more circuits that incorporate electrical components and/or electronics across circuit board 102.

Conductive contacts 104 each generally represent any contact and/or pad that is included and/or incorporated on a circuit board and designed to facilitate soldering and/or coupling a communication device to the circuit board. In one example, conductive contacts 104 may include and/or represent a set of solder pads arranged and/or configured for BGA-packaged devices. In this example, conductive contacts 104 may carry and/or transmit electrical and/or communication signals via circuit board 102 in connection with a BGA-packaged communication device. Conductive contacts 104 may include and/or represent any of the electrically conductive materials listed above in connection with circuit board 102.

In one example, each of conductive contacts 104 may correspond to and/or represent a different signal and/or portion of a circuit that involves a BGA-packaged communication device. For example, one conductive contact may correspond to and/or represent a power bus, and another one may correspond to and/or represent electrical ground. Additionally or alternatively, one conductive contact may correspond to and/or represent the positive communication signal of a 4-level Pulse Amplitude Modulation (PAM) differential signal pair, and another one may correspond to and/or represent the negative communication signal of the 4-level PAM (also referred to as PAM-4) differential signal pair.

Figure 2:
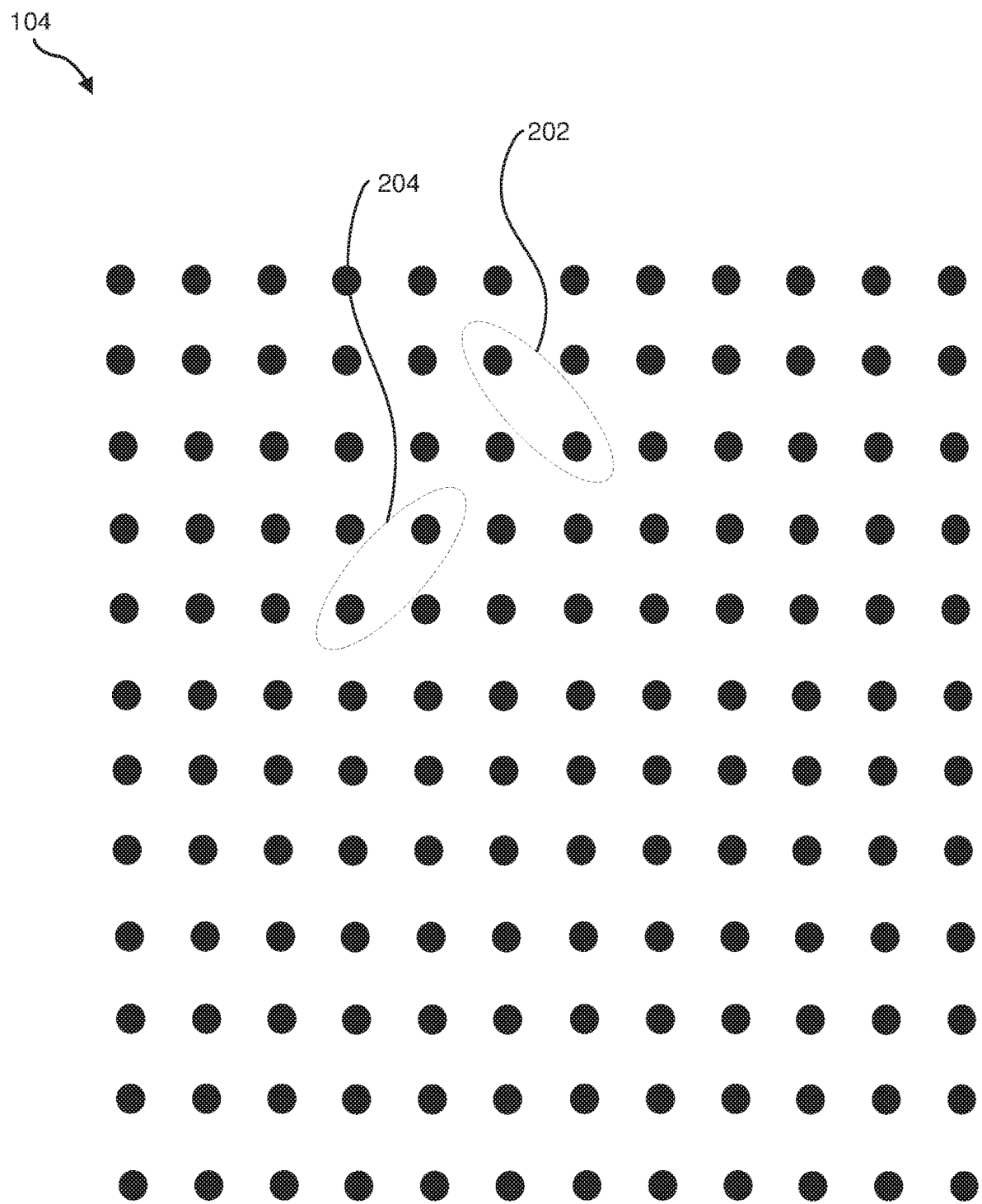
FIG. 2 is an illustration of an exemplary arrangement of conductive contacts incorporated into a circuit board for mitigating crosstalk in BGA devices.

FIG. 2 shows an exemplary arrangement and/or configuration of conductive contacts 104. As illustrated in FIG. 2, conductive contacts 104 may include a first positive/negative contact pair 202 and a second positive/negative contact pair 204. In one example, first positive/negative contact pair 202 may correspond to and/or carry differential signals in connection with a communication device, such as a SerDes device, that implements a differential signaling scheme. For example, first positive/negative contact pair 202 may facilitate electrically coupling the communication device to circuit board 102. In this example, the positive signal of the communication device may be electrically coupled to one of the conductive contacts included in first positive/negative contact pair 202, and the negative signal of the communication device may be electrically coupled to the other conductive contact included in first positive/negative contact pair 202.

Similarly, second positive/negative contact pair 204 may correspond to and/or carry differential signals in connection with another communication device, such as another SerDes device, that implements a differential signaling scheme. For example, second positive/negative contact pair 204 may facilitate electrically coupling this other communication device to circuit board 102. In this example, the positive signal of this other communication device may be electrically coupled to one of the conductive contacts included in second positive/negative contact pair 204, and the negative signal of this other communication device may be electrically coupled to the other conductive contact included in second positive/negative contact pair 204.

In some examples, positive/negative contact pairs 202 and 204 may facilitate the transfer of differential signals. In one example, each of these differential signals may represent part of a differential signaling scheme. Examples of such a differential signaling scheme include, without limitation, PAM, PAM-4, 3-level PAM, 5-level PAM, 8-level PAM, 16-level PAM, Non-Return-to-Zero (NRZ) signaling, Serial AT Attachment (SATA) signaling, Low-Voltage Differential Signaling (LVDS), HyperTransport signaling, Ethernet (e.g., 10-gigabit Ethernet), variations or combinations of one or more of the same, and/or any other suitable differential signaling scheme.

Figure 3:
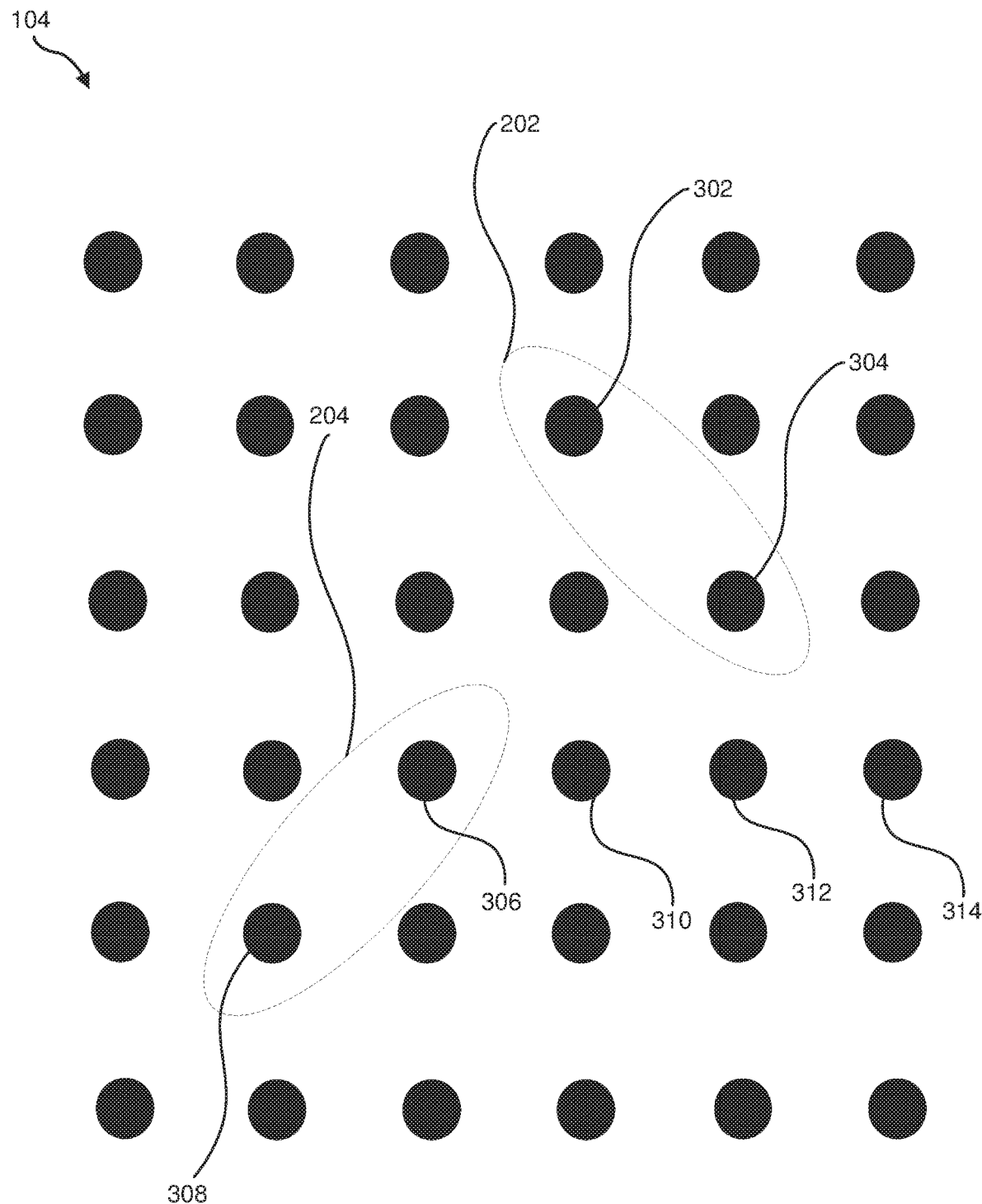
FIG. 3 is an illustration of an exemplary arrangement of conductive contacts incorporated into a circuit board for mitigating crosstalk in BGA devices.

FIG. 3 shows an exemplary arrangement and/or configuration of conductive contacts 104. As illustrated in FIG. 3, and similar to FIG. 2, conductive contacts 104 may include first positive/negative contact pair 202 and second positive/negative contact pair 204. In some examples, first positive/negative contact pair 202 may include and/or represent a positive contact 302 and a negative contact 304. Similarly, second positive/negative contact pair 204 may include and/or represent a positive contact 308 and a negative contact 306.

In some examples, positive contact 302 and negative contact 304 may carry and/or facilitate the transfer of signals that are equal in magnitude and opposite in polarity. Similarly, positive contact 308 and negative contact 306 may carry and/or facilitate the transfer of signals that are equal in magnitude and opposite in polarity.

In some examples, conductive contacts 104 may also include various contacts that are electrically grounded. As illustrated in FIG. 3, conductive contacts 104 may include ground contacts 310, 312, and 314. In one example, all the unlabeled contacts in FIG. 3 may also be electrically grounded. In this example, first positive/negative contact pair 202 and second positive/negative contact pair 204 may be the only non-grounded contacts in FIG. 3.

Figure 4:
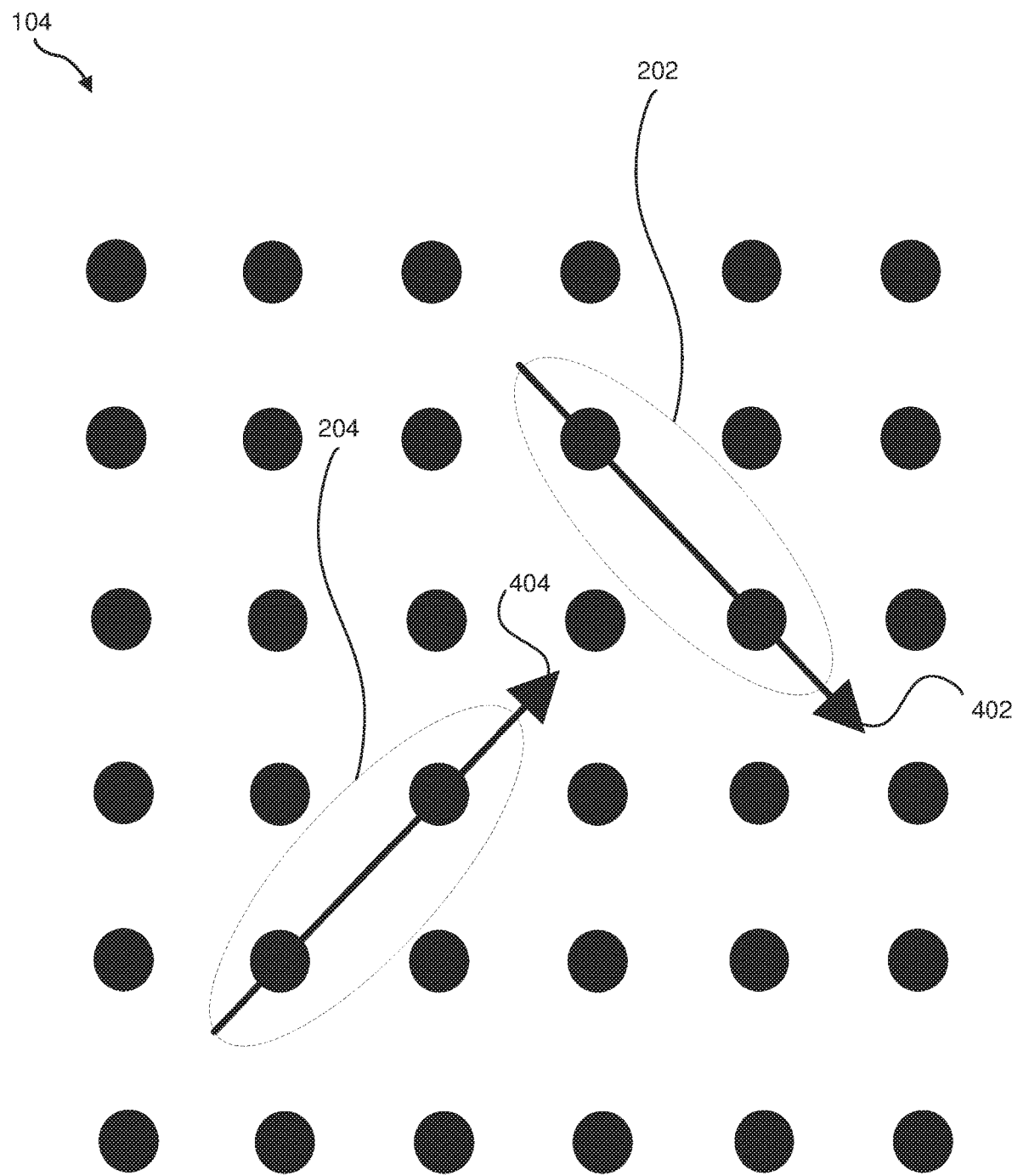
FIG. 4 is an illustration of an exemplary arrangement of conductive contacts incorporated into a circuit board for mitigating crosstalk in BGA devices.

FIG. 4 shows an exemplary arrangement and/or configuration of conductive contacts 104. As illustrated in FIG. 4, and similar to FIGS. 2 and 3, conductive contacts 104 may include first positive/negative contact pair 202 and second positive/negative contact pair 204. In some examples, first positive/negative contact pair 202 may be arranged and/or laid out in a first direction 402 along circuit board 102. In such examples, second positive/negative contact pair 204 may be arranged and/or laid out in a second direction 404 along circuit board 102.

As illustrated in FIG. 4, first direction 402 and second direction 404 may be perpendicular and/or orthogonal to one another. For example, first direction 402 and second direction 404 may be represented and/or demonstrated by arrows in FIG. 4. Although first direction 402 and second direction 404 are depicted in a certain way in FIG. 4, the depiction of first direction 402 and second direction 404 in FIG. 4 is merely exemplary. Various other arrangements and/or layouts of first direction 402 and second direction 404 may provide the same benefits and/or advantages as the one depicted in FIG. 4. As a specific example, first direction 402 may alternatively point and/or be directed opposite the corresponding arrow illustrated in FIG. 4. Additionally, second direction 404 may alternatively point and/or be directed opposite the corresponding arrow illustrated in FIG. 4.

Figure 5:
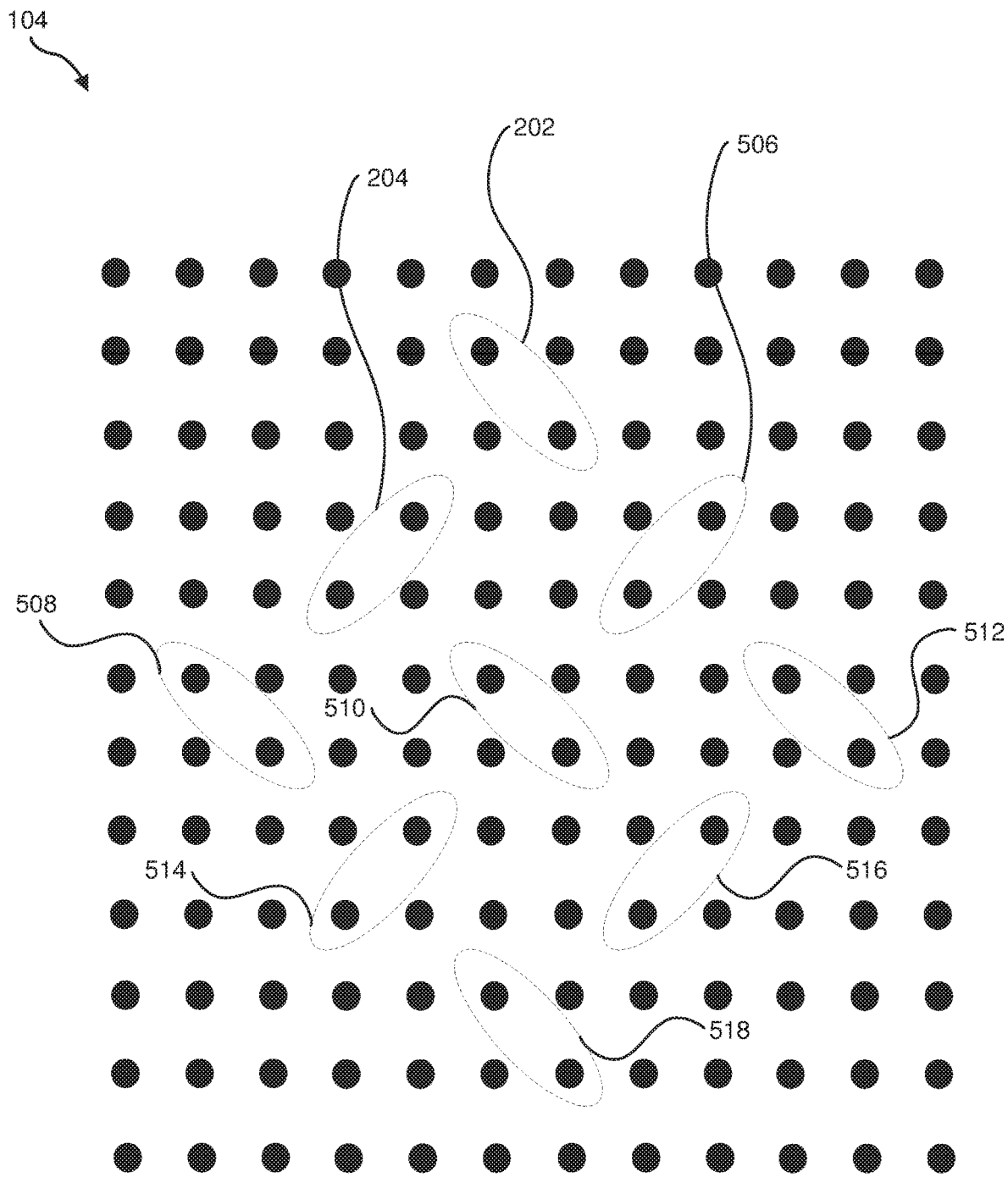
FIG. 5 is an illustration of an exemplary arrangement of conductive contacts incorporated into a circuit board for mitigating crosstalk in BGA devices.

FIG. 5 shows an exemplary arrangement and/or configuration of conductive contacts 104. As illustrated in FIG. 5, and similar to FIGS. 2-4, conductive contacts 104 may include first positive/negative contact pair 202 and second positive/negative contact pair 204. In addition, conductive contacts 104 in FIG. 5 may include a third positive/negative contact pair 506, a fourth positive/negative contact pair 508, a fifth positive/negative contact pair 510, a sixth positive/negative contact pair 512, a seventh positive/negative contact pair 514, an eighth positive/negative contact pair 516, and a ninth positive/negative contact pair 518. Alternative embodiments of conductive contacts 104 may include any number of positive/negative contact pairs (e.g., more or less than the number of pairs illustrated in FIG. 4).

In some examples, first positive/negative contact pair 202, fourth positive/negative contact pair 508, fifth positive/negative contact pair 510, sixth positive/negative contact pair 512, and ninth positive/negative contact pair 518 may all be arranged and/or laid out in first direction 402 along circuit board 102. Additionally or alternatively, second positive/negative contact pair 204, third positive/negative contact pair 506, seventh positive/negative contact pair 514, and eighth positive/negative contact pair 516 may all be arranged and/or laid out in second direction 404 along circuit board 102.

In some examples, the various positive/negative contact pairs may each be communicatively coupled to a different SerDes devices incorporated into a BGA device. In one example, first positive/negative contact pair 202, second positive/negative contact pair 204, third positive/negative contact pair 506, fourth positive/negative contact pair 508, and fifth positive/negative contact pair 510 may each be coupled to a different SerDes receiver. In this example, sixth positive/negative contact pair 512, seventh positive/negative contact pair 514, eighth positive/negative contact pair 516, and ninth positive/negative contact pair 518 may each be coupled to a different SerDes transmitter. However, these SerDes transmitters and receivers may be interchanged with one another within this arrangement and/or configuration.

In one example, fifth positive/negative contact pair 510 may be communicatively coupled to a victim SerDes receiver that is subjected to and/or affected by crosstalk. In this example, the exemplary arrangement and/or configuration of conductive contacts 104 in FIG. 5 may reduce the amount of crosstalk impacting and/or experienced by the victim SerDes receiver communicatively coupled to fifth positive/negative contact pair 510.

In one example, all the unlabeled contacts in FIG. 5 may be electrically grounded. In this example, first positive/negative contact pair 202, second positive/negative contact pair 204, third positive/negative contact pair 506, fourth positive/negative contact pair 508, fifth positive/negative contact pair 510, sixth positive/negative contact pair 512, seventh positive/negative contact pair 514, eighth positive/negative contact pair 516, and ninth positive/negative contact pair 518 may be the only non-grounded contacts in FIG. 3.

As illustrated in FIG. 5, the various positive/negative contact pairs that carry SerDes communication signals may each be assigned, arranged, and/or configured diagonally within conductive contacts 104. In other words, these positive/negative contact pairs may each be oriented in a diagonal arrangement and/or pattern within conductive contacts 104. Such diagonal arrangements and/or patterns may reduce and/or mitigate crosstalk among fanout vias (such as those illustrated in FIG. 7).

In some examples, the positive/negative contact pairs may be assigned and/or arranged diagonally, as opposed to vertically or horizontally, within a 1-millimeter BGA pattern and/or pinout. Additionally or alternatively, the orientation of the diagonal positive/negative contact pairs may alternate from one row to another or from one column to another. In other words, the orientation of the diagonal positive/negative contact pairs included in one row or column may be opposite of the orientation of the diagonal positive contact pairs included in an adjacent row or column. For example, in row or column "n", the positive/negative contact pairs may each be oriented to run diagonally from top left to bottom right. In this example, in row or column "n+1", the positive/negative contact pairs may each be oriented to run diagonally from bottom left to top right.

The diagonal arrangement and/or assignment of positive/negative contact pairs in FIG. 5 may exhibit and/or implement certain principles, phenomena, and/or mechanisms that mitigate crosstalk in BGA devices. For example, the diagonal arrangement and/or assignment of positive/negative contact pairs in FIG. 5 may precipitate the principles of noise cancellation in differential signaling and destructive interference due to superposition, which serve to mitigate crosstalk in BGA devices. Additionally or alternatively, this diagonal arrangement and/or assignment of positive/negative contact pairs may increase the effective pitch between the differential signals from the 1-millimeter standard to approximately 1.41 millimeters. This increased pitch between the differential signals may reduce the capacitive impedance discontinuity by a significant amount, thereby further improving the performance of the BGA devices.

Figure 6:
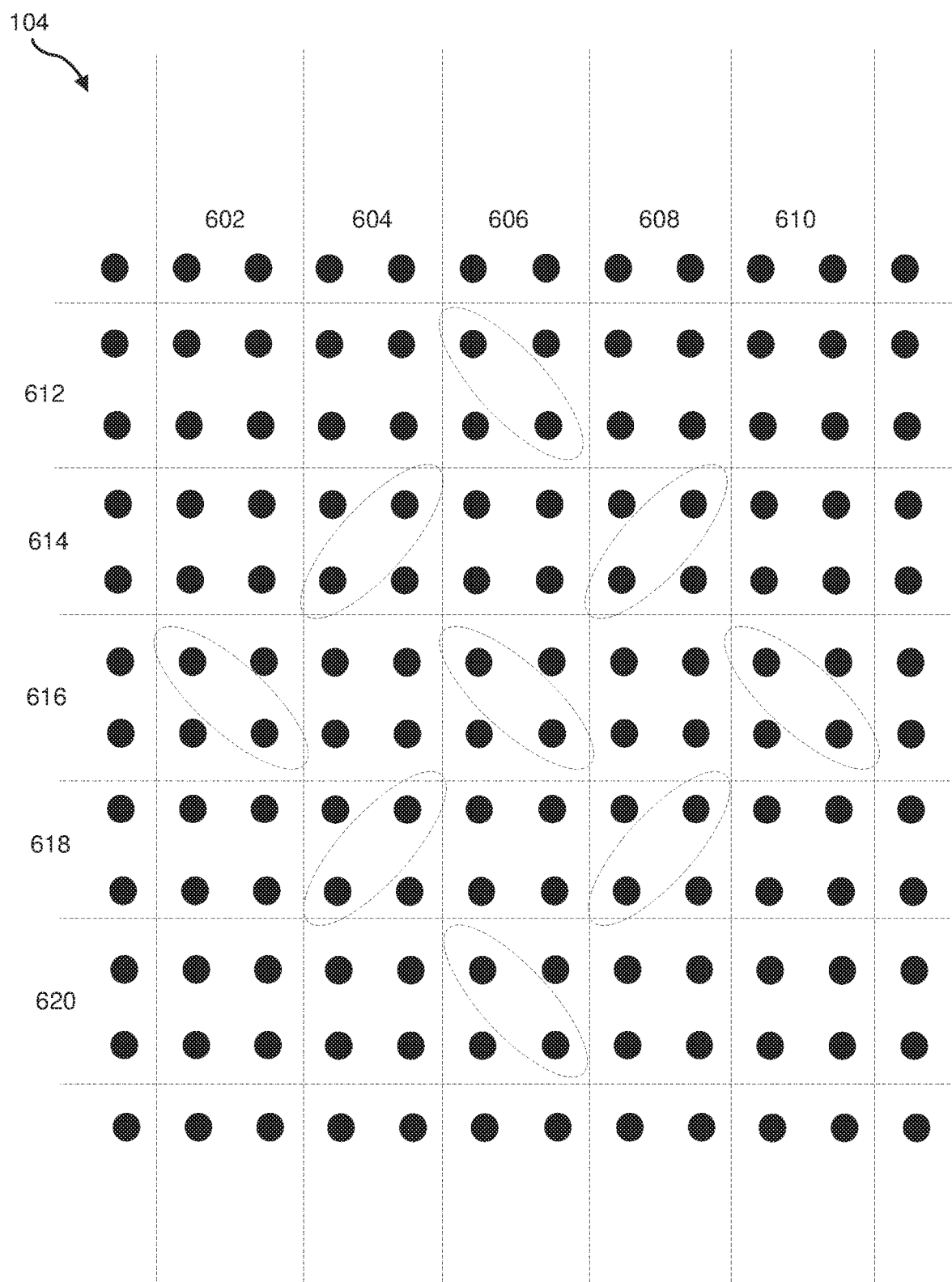
FIG. 6 is an illustration of an exemplary arrangement of conductive contacts incorporated into a circuit board for mitigating crosstalk in BGA devices.

FIG. 6 shows an exemplary arrangement and/or configuration of conductive contacts 104. As illustrated in FIG. 6, and similar to FIGS. 2-5, conductive contacts 104 may include the various positive/negative contact pairs discussed above in connection with FIG. 5. In some examples, circuit board 102 may include and/or form certain rows and/or columns in which conductive contacts 104 are arranged and/or laid out. For example, circuit board 102 may include and/or form rows 612, 614, 616, 618, and 620 as well as columns 602, 604, 606, 608, and 610 in which conductive contacts 104 are arranged and/or laid out.

As illustrated in FIG. 6, fourth positive/negative contact pair 508 may be positioned in a first column 602 of circuit board 102. In some examples, second positive/negative contact pair 204 and seventh positive/negative contact pair 514 may both be positioned in a second column 604 of circuit board 102. Second column 604 may be adjacent and/or next to first column 602.

As illustrated in FIG. 6, first positive/negative contact pair 202, fifth positive/negative contact pair 510, and ninth positive/negative contact pair 518 may all be positioned in a third column 606 of circuit board 102. Third column 606 may be adjacent and/or next to second column 604. In some examples, third positive/negative contact pair 506 and eighth positive/negative contact pair 516 may both be positioned in a fourth column 608 of circuit board 102. Fourth column 608 may be adjacent and/or next to third column 606. Additionally or alternatively, sixth positive/negative contact pair 512 may be positioned in a fifth column 610 of circuit board 102. Fifth column 610 may be adjacent and/or next to fourth column 608.

As illustrated in FIG. 6, fourth positive/negative contact pair 508 may be positioned in a first column 602 of circuit board 102. In some examples, second positive/negative contact pair 204 and seventh positive/negative contact pair 514 may both be positioned in a second column 604 of circuit board 102. Second column 604 may be adjacent and/or next to first column 602.

Continuing with the example illustrated in FIG. 6, first positive/negative contact pair 202 may be positioned in a first row 612 of circuit board 102. In addition, second positive/negative contact pair 204 and third positive/negative contact pair 506 may both be positioned in a second row 614 of circuit board 102. Second row 614 may be adjacent and/or next to first row 612. Fourth positive/negative contact pair 508, fifth positive/negative contact pair 510, and sixth positive/negative contact pair 512 may all be positioned in a third row 616 of circuit board 102. Third row 616 may be adjacent and/or next to second row 614.

As illustrated in FIG. 6, seventh positive/negative contact pair 514 and eighth positive/negative contact pair 516 may both be positioned in a fourth row 618 of circuit board 102. Fourth row 618 may be adjacent and/or next to third row 616. Finally, ninth positive/negative contact pair 518 may be positioned in a fifth row 620 of circuit board 102. Fifth row 620 may be adjacent and/or next to fourth row 618.

Figure 7:
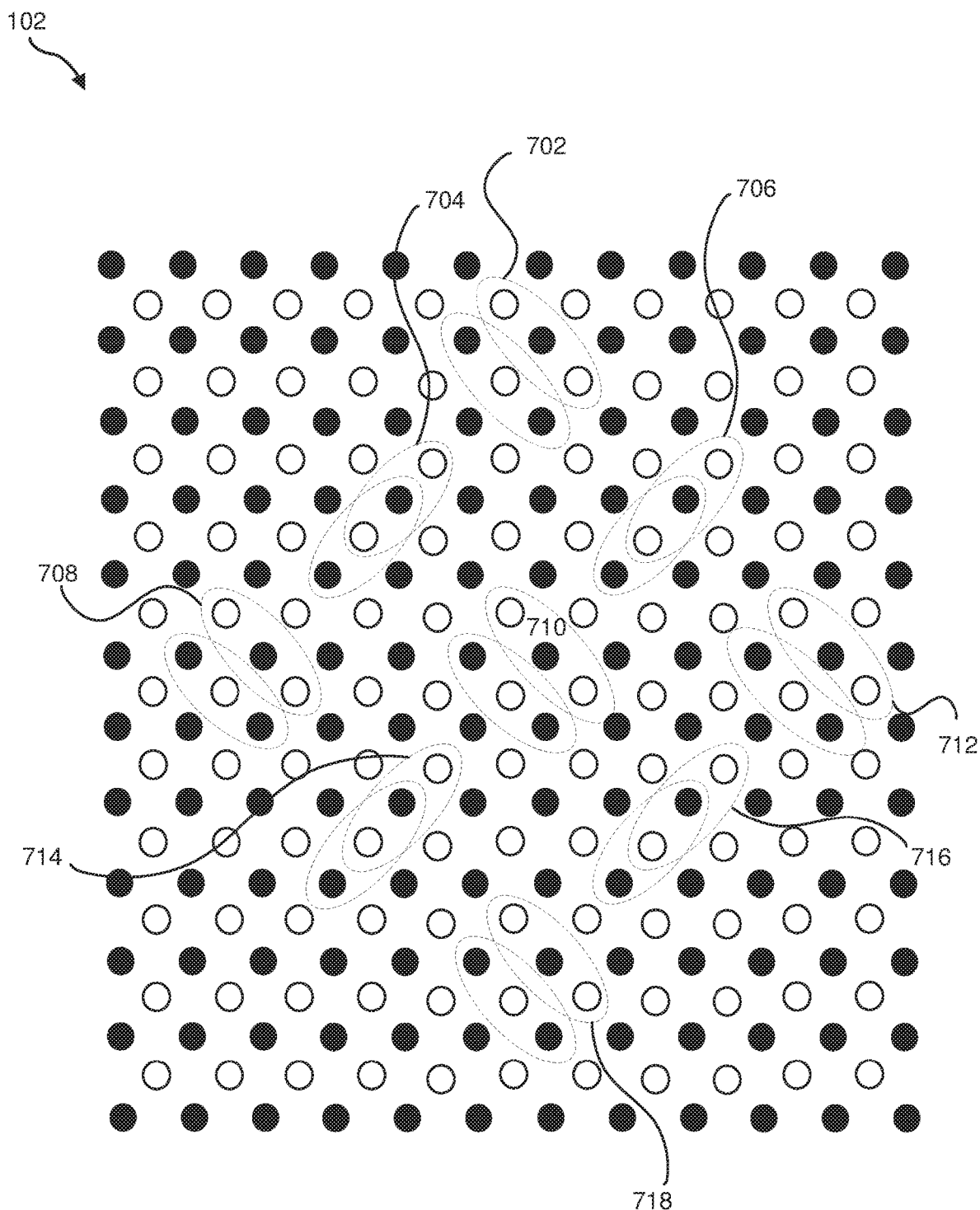
FIG. 7 is an illustration of an exemplary arrangement of conductive contacts and vias incorporated into a circuit board for mitigating crosstalk in BGA devices.

FIG. 7 shows an exemplary arrangement and/or configuration of conductive contacts and conductive vias disposed on circuit board 102. As illustrated in FIG. 7, and similar to FIGS. 2-6, circuit board 102 may include and/or form the various positive/negative contact pairs discussed above in connection with FIGS. 5 and 6. In some examples, circuit board 102 may also include and/or form various conductive vias. In such examples, these conductive vias may be incorporated and/or formed into and/or run across multiple layers of circuit board 102. As will be described in greater detail below, these conductive vias may electrically couple certain conductive traces disposed on one layer of circuit board 102 with conductive traces disposed on another layer of circuit board 102.

As illustrated in FIG. 7, circuit board 102 may incorporate and/or form a first pair of conductive vias 702. In some examples, first pair of conductive vias 702 may be electrically coupled to first positive/negative contact pair 202 by way of conductive traces (not necessarily visible in FIG. 7). In one example, these conductive traces may run between first pair of conductive vias 702 and first positive/negative contact pair 202 in second direction 404.

As illustrated in FIG. 7, circuit board 102 may also incorporate and/or form a second pair of conductive vias 704. In some examples, second pair of conductive vias 704 may be electrically coupled to second positive/negative contact pair 204 byway of conductive traces (not necessarily visible in FIG. 7). In one example, these conductive traces may run between second pair of conductive vias 704 and second positive/negative contact pair 204 in second direction 404.

As illustrated in FIG. 7, circuit board 102 may further incorporate and/or form a third pair of conductive vias 706. In some examples, third pair of conductive vias 706 may be electrically coupled to third positive/negative contact pair 506 by way of conductive traces (not necessarily visible in FIG. 7). In one example, these conductive traces may run between third pair of conductive vias 706 and third positive/negative contact pair 506 in second direction 404.

As illustrated in FIG. 7, circuit board 102 may additionally incorporate and/or form a fourth pair of conductive vias 708. In some examples, fourth pair of conductive vias 708 may be electrically coupled to fourth positive/negative contact pair 508 by way of conductive traces (not necessarily visible in FIG. 7). In one example, these conductive traces may run between fourth pair of conductive vias 708 and fourth positive/negative contact pair 508 in second direction 404.

As illustrated in FIG. 7, circuit board 102 may also incorporate and/or form a fifth pair of conductive vias 710. In some examples, fifth pair of conductive vias 710 may be electrically coupled to fifth positive/negative contact pair 510 by way of conductive traces (not necessarily visible in FIG. 7). In one example, these conductive traces may run between fifth pair of conductive vias 710 and fifth positive/negative contact pair 510 in second direction 404.

As illustrated in FIG. 7, circuit board 102 may further incorporate and/or form a sixth pair of conductive vias 712. In some examples, sixth pair of conductive vias 712 may be electrically coupled to sixth positive/negative contact pair 512 by way of conductive traces (not necessarily visible in FIG. 7). In one example, these conductive traces may run between sixth pair of conductive vias 712 and sixth positive/negative contact pair 512 in second direction 404.

As illustrated in FIG. 7, circuit board 102 may additionally incorporate and/or form a seventh pair of conductive vias 714. In some examples, seventh pair of conductive vias 714 may be electrically coupled to seventh positive/negative contact pair 514 by way of conductive traces (not necessarily visible in FIG. 7). In one example, these conductive traces may run between seventh pair of conductive vias 714 and seventh positive/negative contact pair 514 in second direction 404.

As illustrated in FIG. 7, circuit board 102 may additionally incorporate and/or form an eighth pair of conductive vias 716. In some examples, eighth pair of conductive vias 716 may be electrically coupled to eighth positive/negative contact pair 516 by way of conductive traces (not necessarily visible in FIG. 7). In one example, these conductive traces may run between eighth pair of conductive vias 716 and eighth positive/negative contact pair 516 in second direction 404.

As illustrated in FIG. 7, circuit board 102 may additionally incorporate and/or form a ninth pair of conductive vias 718. In some examples, ninth pair of conductive vias 718 may be electrically coupled to ninth positive/negative contact pair 518 by way of conductive traces (not necessarily visible in FIG. 7). In one example, these conductive traces may run between ninth pair of conductive vias 718 and ninth positive/negative contact pair 518 in second direction 404.

In some examples, crosstalk may be cancelled out among contact pairs that are immediately adjacent to one another in row and/or column. For example, fifth positive/negative contact pair 510 may correspond to and/or represent a SerDes victim affected by crosstalk induced by various aggressors, such as second positive/negative contact pair 204, third positive/negative contact pair 506, seventh positive/negative contact pair 514, and eighth positive/negative contact pair 516. In this example, third positive/negative contact pair 506 and seventh positive/negative contact pair 514 may induce crosstalk cancellation for fifth positive/negative contact pair 510 and/or fifth pair of conductive vias 710 due to spatial symmetry. In particular, in-phase equal magnitude crosstalk may be induced on the positive contact and the negative contact of pair 510 and/or vias 710 simultaneously. However, by the principle of noise cancellation in differential signaling, the same amount of noise induced on the positive and negative contacts of pair 510 and/or vias 710 may be cancelled at the destination.

Additionally or alternatively, second positive/negative contact pair 204 and eighth positive/negative contact pair 516 may induce crosstalk cancellation for fifth positive/negative contact pair 510 due to spatial symmetry. In particular, opposite-phase equal magnitude crosstalk may be induced on the positive contact and the negative contact of pair 510 and/or vias 710 simultaneously. However, by the principle of destructive interference due to superposition, the opposite-phase noise may superimpose and/or cancel out one another.

Figure 8:
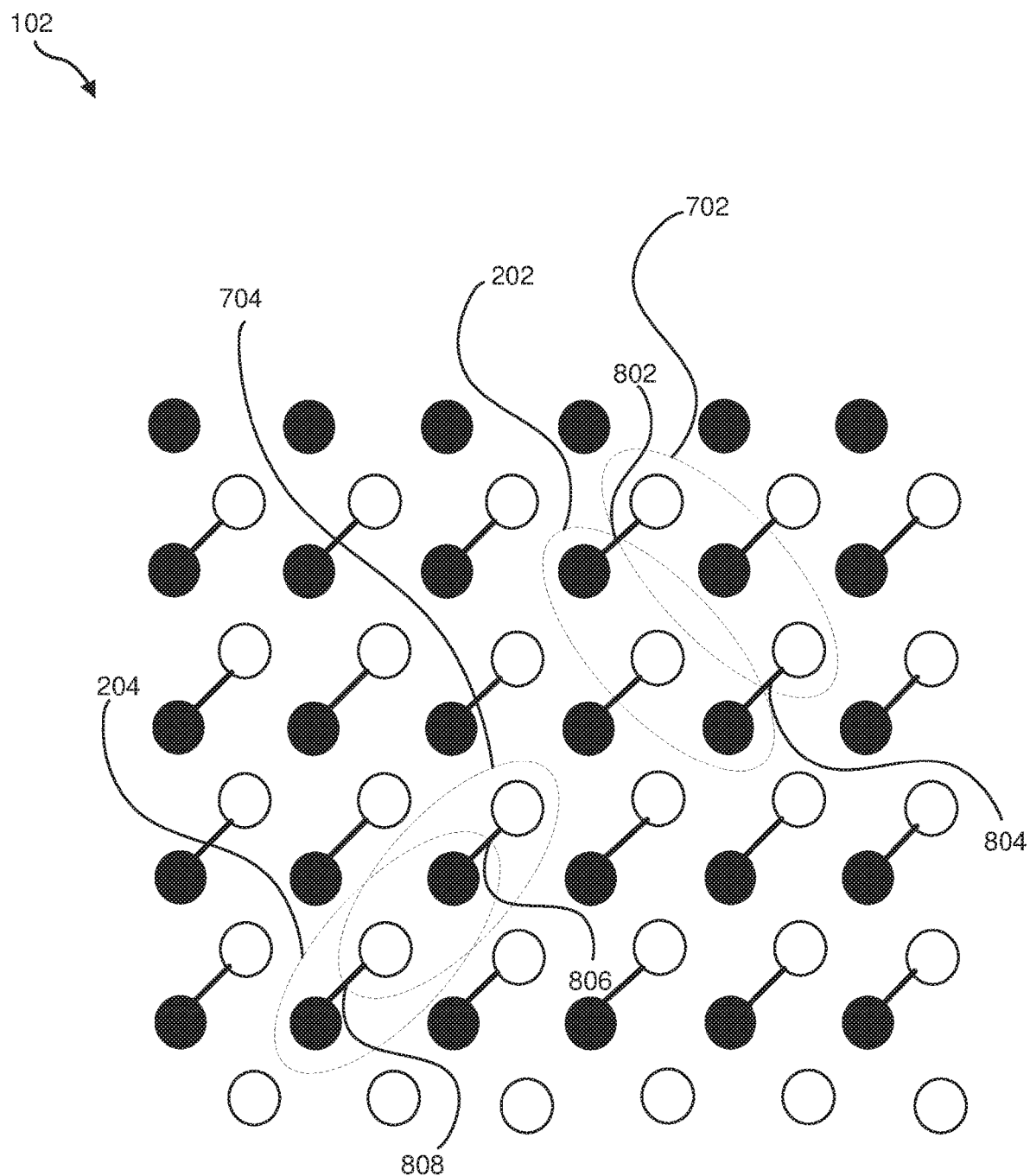
FIG. 8 is an illustration of an exemplary arrangement of conductive contacts and vias incorporated into a circuit board for mitigating crosstalk in BGA devices.

FIG. 8 shows an exemplary arrangement and/or configuration of conductive contacts and conductive vias disposed on circuit board 102. As illustrated in FIG. 8, and similar to FIG. 3, circuit board 102 may include and/or form first positive/negative contact pair 202 and second positive/negative contact pair 204. In addition, circuit board 102 may include and/or form first pair of conductive vias 702 and second pair of conductive vias 704.

As illustrated in FIG. 8, first positive/negative contact pair 202 and first pair of conductive vias 702 may be electrically coupled to one another by way of conductive traces 802 and 804. Similarly, second positive/negative contact pair 204 and second pair of conductive vias 704 may be electrically coupled to one another by way of conductive traces 806 and 808.

Figure 9:
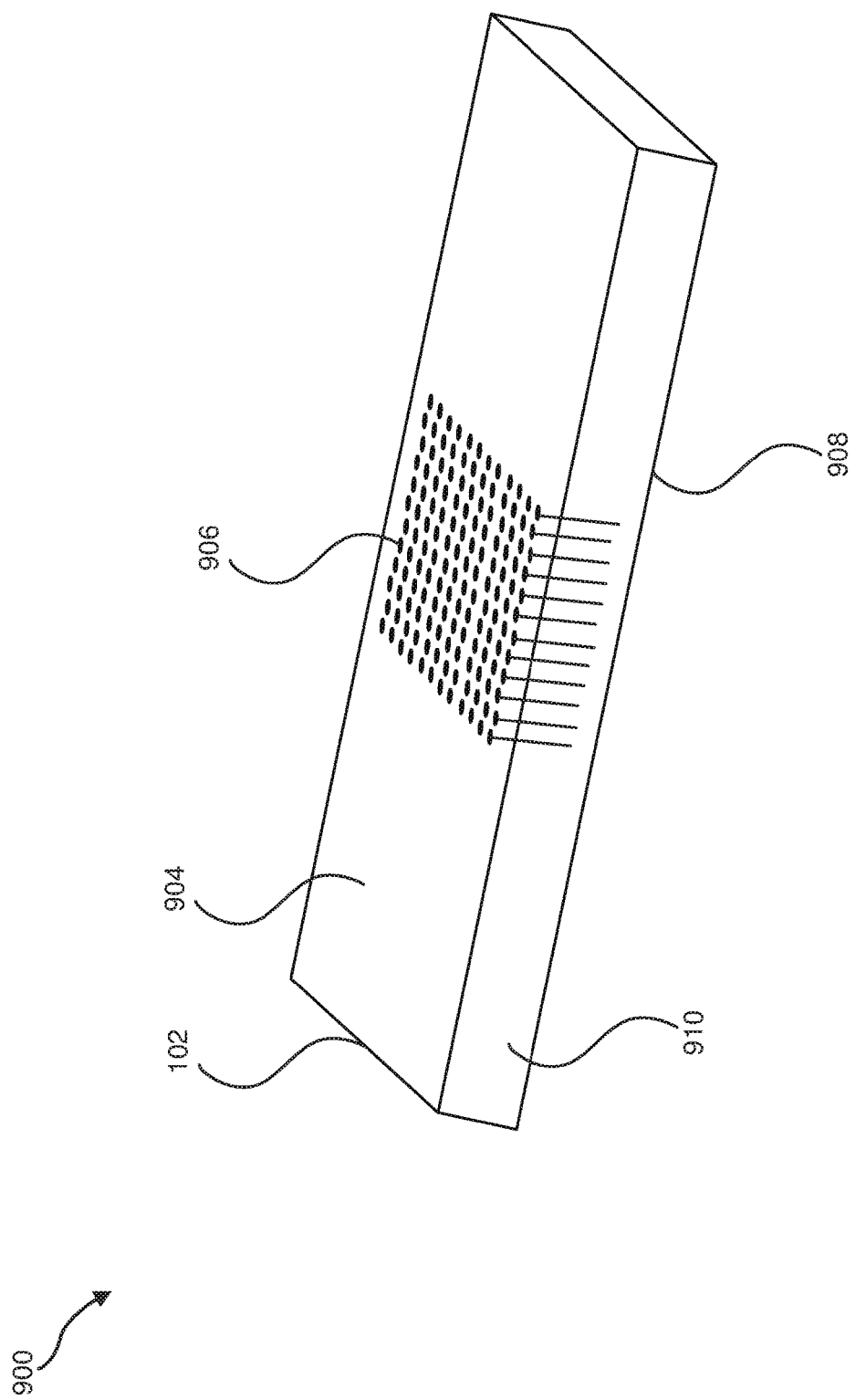
FIG. 9 is an illustration of an exemplary apparatus for mitigating crosstalk in BGA devices.
Figure 10:
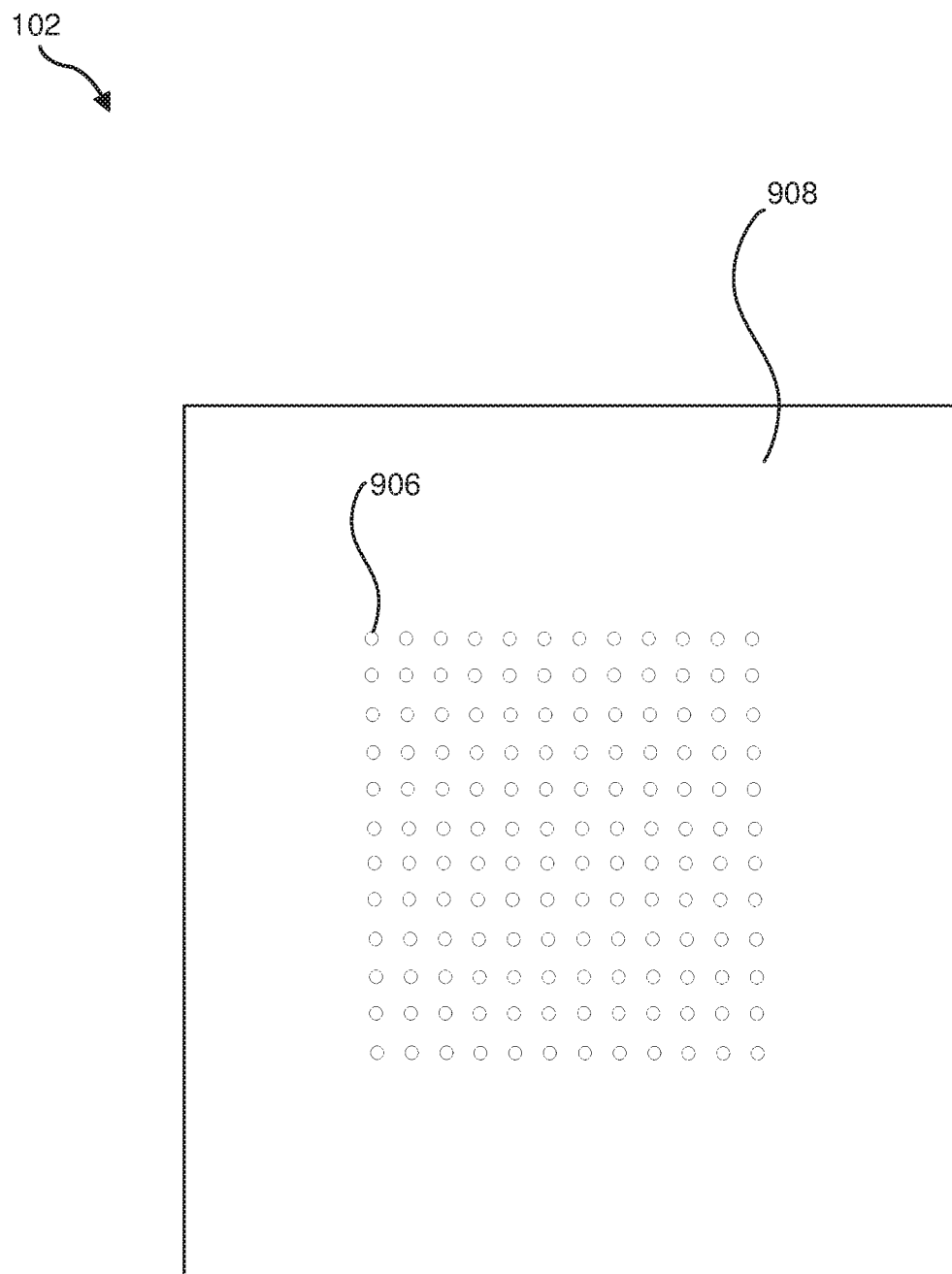
FIG. 10 is an illustration of an exemplary circuit board that facilitates mitigating crosstalk in BGA devices.

FIGS. 9 and 10 show an exemplary set of conductive vias 906 incorporated into circuit board 102. As illustrated in FIG. 9, circuit board 102 may include a top layer 904, an inner layer 910, and a bottom layer 908. In some examples, conductive vias 906 may electrically couple top layer 904 and bottom layer 908 to one another by way of inner layer 910. In such examples, conductive vias 906 may facilitate the transfer of communication signals among top layer 904, inner layer 910, and/or bottom layer 908.

Figure 11:
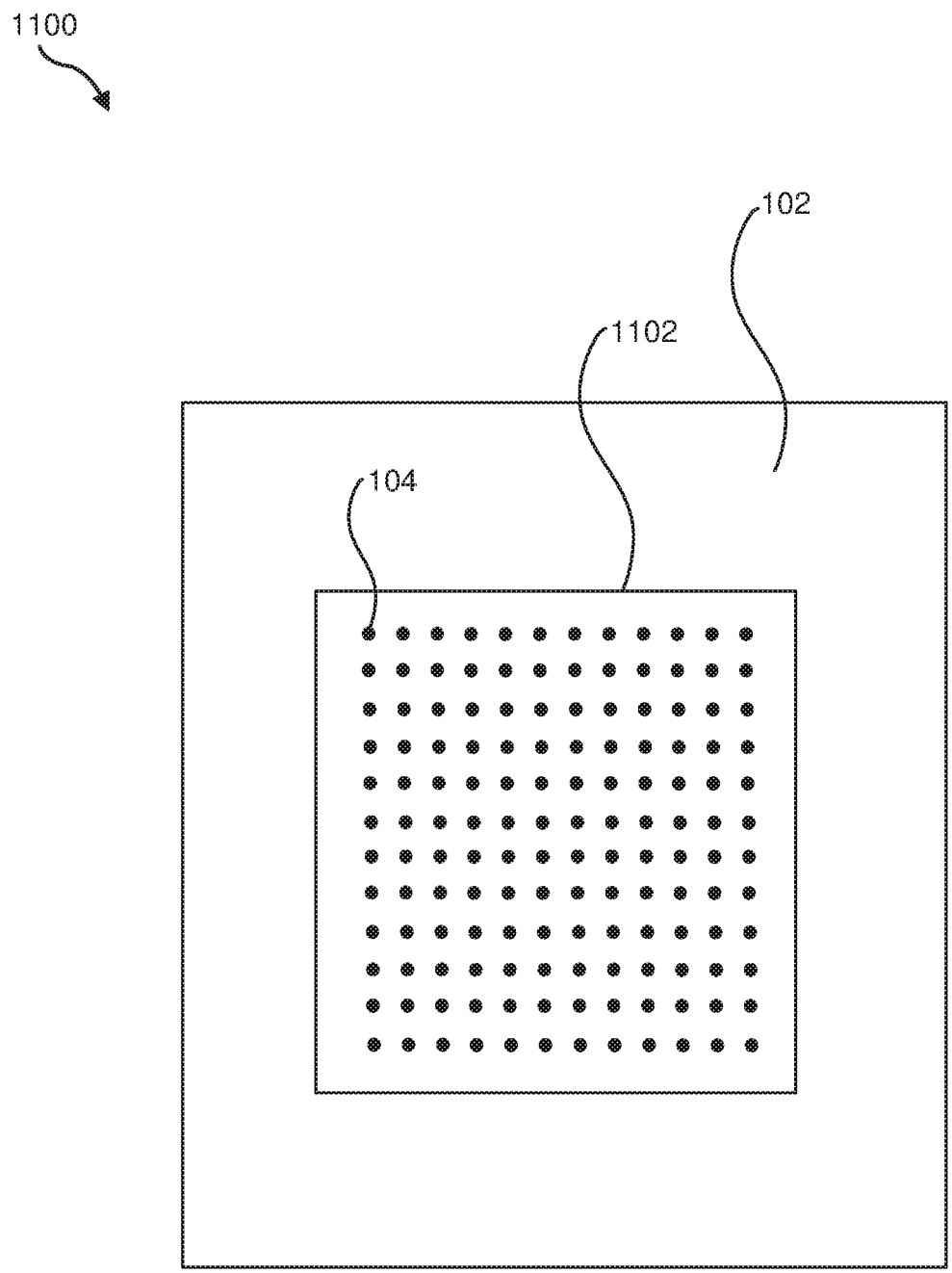
FIG. 11 is an illustration of an exemplary system for mitigating crosstalk in BGA devices.

FIG. 11 shows an exemplary system 1100 that facilitates mitigating crosstalk in a communication device 1102. In some examples, system 1100 may be incorporated into a network device that facilitates communication within a network. As illustrated in FIG. 11, system 1100 may include and/or represent circuit board 102 and communication device 1102. In one example, communication device 1102 may be electrically coupled to circuit board 102 by way of conductive conducts 104. Communication device 1102 may represent a BGA package that includes one or more SerDes devices that transmit and/or receive communications as part of the network device.

Figure 12:
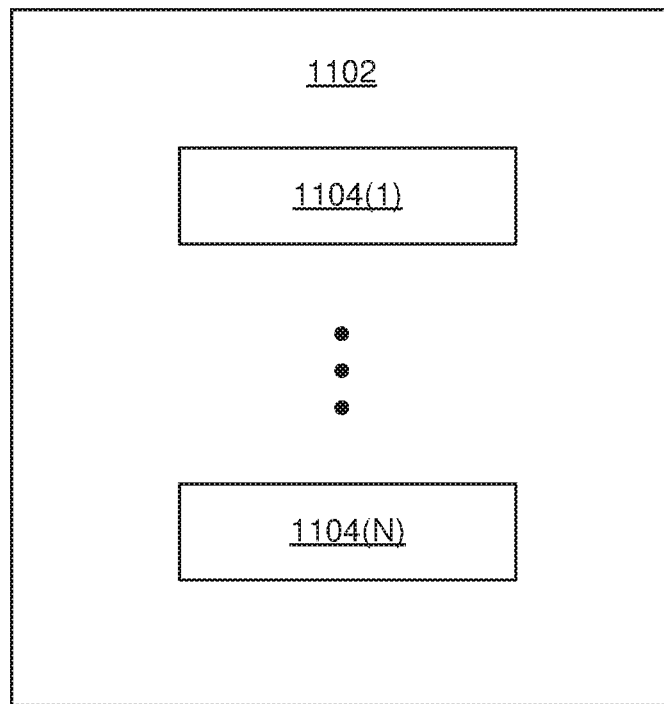
FIG. 12 is a block diagram of an exemplary BGA device whose crosstalk is mitigated by the apparatus illustrated in FIG. 1.

FIG. 12 shows exemplary SerDes devices 1104(1)-(N) included and/or incorporated in communication device 1102. In some examples, communication device 1102 may include and/or represent a BGA-packaged system that includes SerDes devices 1104(1)-(N). In such examples, SerDes devices 1104(1)-(N) may each be communicatively coupled to one of the various positive/negative contact pairs discussed above in connection with FIGS. 5 and 6. In one example, SerDes devices 1104(1)-(N) may each transmit and/or receive communications as part of a network device within a network. Some of SerDes devices 1104(1)-(N) may be transmitters, and others may be receivers.

Figure 13:
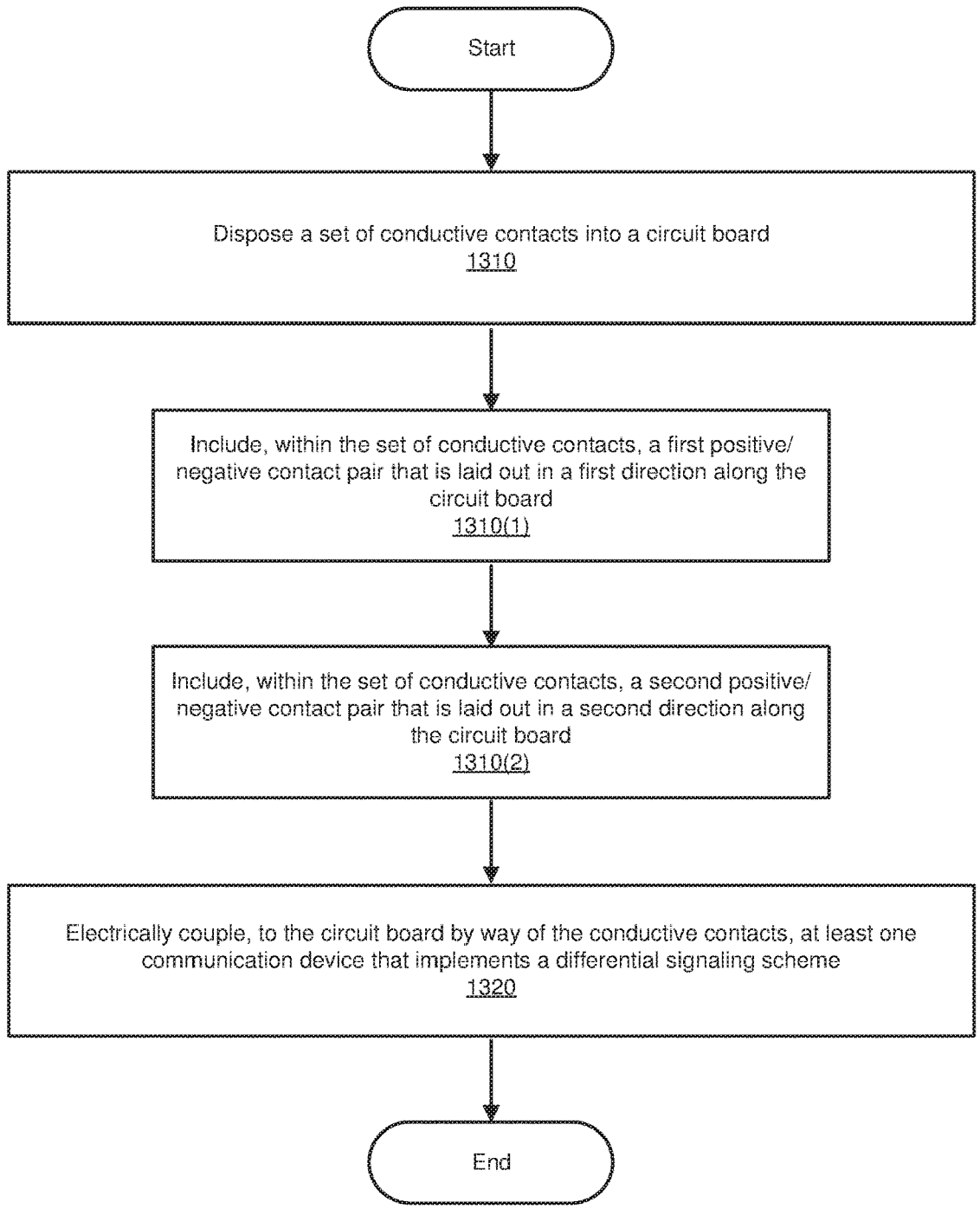
FIG. 13 is a flow diagram of an exemplary method for mitigating crosstalk in BGA devices.

FIG. 13 is a flow diagram of an exemplary method 1300 for mitigating crosstalk in ball grid array devices. Method 1300 may include the step of disposing a set of conductive contacts into a circuit board (1310). Step 1310 may be performed in a variety of ways, including any of those described above in connection with FIGS. 1-12. For example, a computing equipment manufacturer or subcontractor may dispose, etch, and/or plate conductive contacts 104 into circuit board 102. In this example, and as shown in step 1310(1), the computing equipment manufacturer or subcontractor may include, within conductive contacts 104, first positive/negative contact pair 202 laid out in first direction 402 along circuit board 102. In addition, and as shown in step 1310(2), the computing equipment manufacturer or subcontractor may include, within conductive contacts 104, second positive/negative contact pair 204 laid out in second direction 404 along circuit board 102.

Method 1300 may also include the step of electrically coupling, to the circuit board by way of the conductive contacts, at least one communication device that implements a differential signaling scheme (1320). Step 1320 may be performed in a variety of ways, including any of those described above in connection with FIGS. 1-12. For example, the computing equipment manufacturer or subcontractor may electrically and/or communicatively couple at least one BGA-packaged communication device to circuit board 102 by way of conductive contacts 104. In one example, this coupling may be facilitated and/or performed by soldering the BGA-packaged communication device to conductive contacts 104 of circuit board 102. In this example, the BGA-packaged communication device may implement a differential signaling scheme (such as PAM-4). While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered exemplary in nature since many other architectures can be implemented to achieve the same functionality.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An apparatus comprising:
    a circuit board; and
    a set of conductive contacts incorporated into the circuit board, wherein the conductive contacts:
        include a first positive/negative contact pair that is laid out in a first direction on the circuit board, wherein the first positive/negative contact pair comprises a first positive contact and a first negative contact that carry signals equal in magnitude and opposite in Polarity relative to one another;
        include a second positive/negative contact pair that is laid out in a second direction on the circuit board, wherein the first direction and the second direction are perpendicular to one another and the second positive/negative contact pair comprises a second positive contact and a second negative contact that carry signals equal in magnitude and opposite in Polarity relative to one another; and
        facilitate electrically coupling, to the circuit board, at least one communication device that implements a differential signaling scheme.

2. The apparatus of claim 1, wherein:
    the first positive/negative contact pair is positioned in a first row of the circuit board; and
    the second positive/negative contact pair is positioned in a second row of the circuit board that is adjacent to the first row of the circuit board.

3. The apparatus of claim 2, wherein the conductive contacts further include a third positive/negative contact pair that:
    is laid out in the second direction on the circuit board; and
    is positioned in the second row of the circuit board adjacent to the first row of the circuit board.

4. The apparatus of claim 3, wherein the conductive contacts further include a fourth positive/negative contact pair, a fifth positive/negative contact pair, and a sixth positive/negative contact pair that:
    are each laid out in the first direction on the circuit board; and
    are each positioned in a third row of the circuit board that is adjacent to the second row of the circuit board.

5. The apparatus of claim 4, wherein the conductive contacts further include a seventh positive/negative contact pair and an eighth positive/negative contact pair that:
    are each laid out in the second direction on the circuit board; and
    are each positioned in a fourth row of the circuit board that is adjacent to the third row of the circuit board.

6. The apparatus of claim 5, wherein the conductive contacts further include a ninth positive/negative contact pair that:
    is laid out in the first direction on the circuit board; and
    is positioned in a fifth row of the circuit board that is adjacent to the fourth row of the circuit board.

7. The apparatus of claim 6, wherein:
    the fourth positive/negative contact pair is also positioned in a first column of the circuit board;
    the second positive/negative contact pair and the seventh positive/negative contact pair are both also positioned in a second column of the circuit board that is adjacent to the first column of the circuit board;
    the first positive/negative contact pair, the fifth positive/negative contact pair, and the ninth positive/negative contact pair are all also positioned in a third column of the circuit board that is adjacent to the second column of the circuit board;
    the third positive/negative contact pair and the eighth positive/negative contact pair are both also positioned in a fourth column of the circuit board that is adjacent to the third column of the circuit board; and
    the sixth positive/negative contact pair is also positioned in a fifth column of the circuit board that is adjacent to the first column of the circuit board.

8. The apparatus of claim 1, wherein the conductive contacts are disposed on a top layer of the circuit board.

9. The apparatus of claim 8, further comprising:
    a first pair of conductive vias incorporated into an inner layer of the circuit board, wherein the first pair of conductive vias are electrically coupled to the first positive/negative contact pair by way of conductive traces that run between the first pair of conductive vias and the first positive/negative contact pair in the second direction; and
    a second pair of conductive vias incorporated into the inner layer of the circuit board, wherein second pair of conductive traces are electrically coupled to the second positive/negative contact pair by way of additional conductive traces that run between the second pair of conductive vias and the second positive/negative contact pair in the second direction.

10. The apparatus of claim 9, wherein:
the circuit board comprises a bottom layer; and
the first pair of conductive vias and the second pair of conductive vias facilitate transfer of communication signals between the top layer of the circuit board and the bottom layer of the circuit board in connection with the communication device.

11. The apparatus of claim 1, wherein the communication device comprises a plurality of SerDes devices that each facilitate transmitting and receiving communications in connection with a network device.

12. A system comprising:
a circuit board;
a set of conductive contacts incorporated into the circuit board, wherein the conductive contacts:
  include a first positive/negative contact pair that is laid out in a first direction on the circuit board, wherein the first positive/negative contact pair comprises a first positive contact and a first negative contact that carry signals equal in magnitude and opposite in Polarity relative to one another; and
  include a second positive/negative contact pair that is laid out in a second direction on the circuit board, wherein the first direction and the second direction are perpendicular to one another and the second positive/negative contact pair comprises a second positive contact and a second negative contact that carry signals equal in magnitude and opposite in Polarity relative to one another; and
at least one communication device electrically coupled to the circuit board by way of the conductive contacts.

13. The system of claim 12, wherein:
the first positive/negative contact pair is positioned in a first row of the circuit board; and
the second positive/negative contact pair is positioned in a second row of the circuit board that is adjacent to the first row of the circuit board.

14. The system of claim 13, wherein the conductive contacts further include a third positive/negative contact pair that:
is laid out in the second direction on the circuit board; and
is positioned in the second row of the circuit board adjacent to the first row of the circuit board.

15. The system of claim 14, wherein the conductive contacts further include a fourth positive/negative contact pair, a fifth positive/negative contact pair, and a sixth positive/negative contact pair that:
are each laid out in the first direction on the circuit board; and
are each positioned in a third row of the circuit board that is adjacent to the second row of the circuit board.

16. The system of claim 15, wherein the conductive contacts further include a seventh positive/negative contact pair and an eighth positive/negative contact pair that:
are each laid out in the second direction on the circuit board; and
are each positioned in a fourth row of the circuit board that is adjacent to the third row of the circuit board.

17. The system of claim 16, wherein the conductive contacts further include a ninth positive/negative contact pair that:
is laid out in the first direction on the circuit board; and
is positioned in a fifth row of the circuit board that is adjacent to the fourth row of the circuit board.

18. The system of claim 17, wherein:
the fourth positive/negative contact pair is also positioned in a first column of the circuit board;
the second positive/negative contact pair and the seventh positive/negative contact pair are both also positioned in a second column of the circuit board that is adjacent to the first column of the circuit board;
the first positive/negative contact pair, the fifth positive/negative contact pair, and the ninth positive/negative contact pair are all also positioned in a third column of the circuit board that is adjacent to the second column of the circuit board;
the third positive/negative contact pair and the eighth positive/negative contact pair are both also positioned in a fourth column of the circuit board that is adjacent to the third column of the circuit board; and
the sixth positive/negative contact pair is also positioned in a fifth column of the circuit board that is adjacent to the first column of the circuit board.

19. The system of claim 12, further comprising:
a first pair of conductive vias incorporated into an inner layer of the circuit board, wherein the first pair of conductive vias are electrically coupled to the first positive/negative contact pair by way of conductive traces that run between the first pair of conductive vias and the first positive/negative contact pair in the second direction; and
a second pair of conductive vias incorporated into the inner layer of the circuit board, wherein second pair of conductive traces are electrically coupled to the second positive/negative contact pair by way of additional conductive traces that run between the second pair of conductive vias and the second positive/negative contact pair in the second direction.

20. A method comprising:
disposing a set of conductive contacts into a circuit board, wherein the conductive contacts:
  include a first positive/negative contact pair that is laid out in a first direction on the circuit board, wherein the first positive/negative contact pair comprises a first positive contact and a first negative contact that carry signals equal in magnitude and opposite in Polarity relative to one another; and
  include a second positive/negative contact pair that is laid out in a second direction on the circuit board, wherein the first direction and the second direction are perpendicular to one another and the second positive/negative contact pair comprises a second positive contact and a second negative contact that carry signals equal in magnitude and opposite in Polarity relative to one another; and
electrically coupling, to the circuit board by way of the conductive contacts, at least one communication device that implements a differential signaling scheme.

* * * * *